(12) United States Patent
Horikoshi

(10) Patent No.: US 10,056,235 B2
(45) Date of Patent: Aug. 21, 2018

(54) MANUFACTURING METHOD OF SEMICONDUCTOR DEVICE

(71) Applicant: Renesas Electronics Corporation, Tokyo (JP)

(72) Inventor: Kotaro Horikoshi, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/498,298

(22) Filed: Apr. 26, 2017

(65) Prior Publication Data

US 2017/0372876 A1 Dec. 28, 2017

(30) Foreign Application Priority Data

Jun. 28, 2016 (JP) .................. 2016-127211

(51) Int. Cl.
*H01J 37/32* (2006.01)
*H01L 21/67* (2006.01)
*H01L 21/683* (2006.01)
*H01L 21/687* (2006.01)

(52) U.S. Cl.
CPC .. *H01J 37/32697* (2013.01); *H01J 37/32715* (2013.01); *H01J 37/32788* (2013.01); *H01L 21/67069* (2013.01); *H01L 21/6831* (2013.01); *H01L 21/68707* (2013.01); *H01L 21/68742* (2013.01); *H01J 2237/0206* (2013.01); *H01J 2237/18* (2013.01); *H01J 2237/334* (2013.01)

(58) Field of Classification Search
CPC ........... H01J 37/32697; H01J 37/32715; H01J 37/32788; H01L 21/67069; H01L 21/6831; H01L 21/68707; H01L 21/68742
See application file for complete search history.

(56) References Cited

U.S. PATENT DOCUMENTS

| 6,174,370 B1 | 1/2001 | Yoshida | |
|---|---|---|---|
| 8,454,758 B2 * | 6/2013 | Akiba | B08B 7/00 134/1 |
| 2011/0147338 A1 * | 6/2011 | Lin | H01L 21/31116 216/13 |
| 2013/0021717 A1 * | 1/2013 | Singh | H01L 21/6831 361/234 |

FOREIGN PATENT DOCUMENTS

| JP | H 09-260475 A | 10/1997 |
|---|---|---|
| JP | 2010-165726 A | 7/2010 |

* cited by examiner

*Primary Examiner* — Duy Vu N Deo
(74) *Attorney, Agent, or Firm* — McGinn I.P. Law Group, PLLC.

(57) ABSTRACT

A manufacturing method of a semiconductor device includes the steps of: (a) placing a semiconductor wafer over a stage provided in a chamber, the pressure in the inside of which is reduced by vacuum pumping; and (b) after the step (a), forming plasma in the chamber in a state where the semiconductor wafer is adsorbed and held by the stage, so that desired etching processing is performed on the semiconductor wafer. Herein, before the step (a), $O_2$ gas, negative gas having an electronegativity higher than that of nitrogen gas, is introduced into the chamber to form $O_2$ plasma in the chamber, thereby allowing the charges remaining over the stage to be eliminated.

20 Claims, 9 Drawing Sheets

| EVALUATION # | STEP 1 NF₃ STEP TIME | STEP 2 O₂ STEP TIME | REMARKS |
|---|---|---|---|
| 1 | 30 SECONDS | 8 SECONDS | EXTEND NF₃ |
| 2 | 45 SECONDS | 8 SECONDS | |
| 3 | 20 SECONDS | 40 SECONDS | EXTEND O₂ |
| 4 | 20 SECONDS | 60 SECONDS | |

| STEP | Time | TCP RF | Bias RF | Press. | NF3 | O2 | ESC temp (IN) | ESC temp (OUT) |
|---|---|---|---|---|---|---|---|---|
| | sec. | Watt | Watt | mTorr | sccm | sccm | °C | °C |
| STEP 1 | 20 | 1000 | 0 | 65 | 200 | - | 60 | 60 |
| STEP 2 | 70 | 1000 | 0 | 15 | - | 200 | 60 | 60 |

| STEP | GAS | CONTENT OF EVALUATION | EFFECT |
|---|---|---|---|
| STEP 1 | $NF_3$ GAS | INCREASE IN TIME | NO EFFECT |
| STEP 2 | $O_2$ GAS | INCREASE IN TIME | EFFECTIVE |

| GROUP<br>PERIOD | 4B | 5B | 6B | 7B | 0 |
|---|---|---|---|---|---|
| 1 ELEMENT NAME | - | - | - | - | He |
| 1 ELECTRONEGATIVITY | - | - | - | - | - |
| 2 | C | N | O | F | Ne |
| 2 | 2.55 | 3.04 | 3.44 | 3.98 | - |
| 3 | Si | P | S | Cl | Ar |
| 3 | 1.9 | 2.19 | 2.58 | 3.16 | - |
| 4 | Ge | As | Se | Br | Kr |
| 4 | 2.01 | 2.18 | 2.55 | 2.96 | 3 |

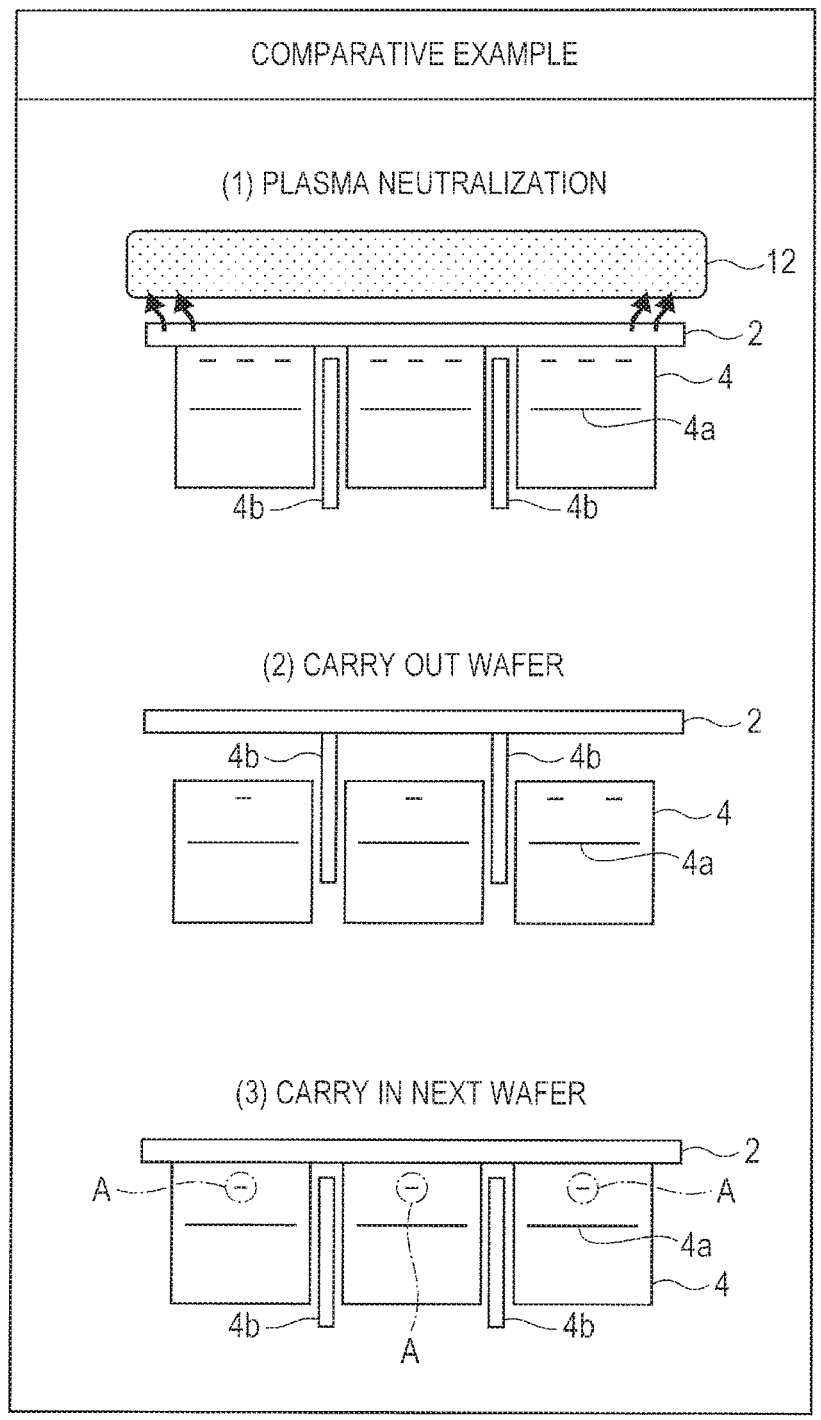

MANUFACTURING METHOD OF SEMICONDUCTOR DEVICE

CROSS-REFERENCE TO RELATED APPLICATIONS

The disclosure of Japanese Patent Application No. 2016-127211 filed on Jun. 28, 2016 including the specification, drawings and abstract is incorporated herein by reference in its entirety.

BACKGROUND

The present invention relates to a manufacturing technique of a semiconductor device in which, for example, plasma processing is performed on a semiconductor wafer.

An etching device referred to as a polysilicon etcher is known as a plasma etching device to be used in the processing of the gate electrode of a semiconductor device. In the polysilicon etcher, etching processing is performed in a state where a semiconductor wafer (a semiconductor substrate, hereinafter also and simply referred to as a wafer) is adsorbed and held to a stage mainly by an electrostatic chuck system.

For example, Japanese Unexamined Patent Application Publication No. Hei 9(1997)-260475 (Patent Document 1) discloses that a wafer is adsorbed and held by an electrostatic chuck system and charges are neutralized by inert gas ionized by a UV light irradiation apparatus.

In addition, for example, Japanese Unexamined Patent Application Publication No. 2010-165726 (Patent Document 2) discloses that a wafer is adsorbed and held by an electrostatic chuck system and static electricity is neutralized by an ionizer.

RELATED ART DOCUMENT

Patent Document

[Patent Document 1] Japanese Unexamined Patent Application Publication No. Hei 9(1997)-260475
[Patent Document 2] Japanese Unexamined Patent Application Publication No. 2010-165726

SUMMARY

In the above polysilicon etcher, after etching processing on a wafer is ended, the charges over the back surface of the wafer are neutralized by introducing inert gas into a chamber, and after that, the wafer is pushed up by raising lift pins such that the wafer is delivered to a transfer arm, whereby the wafer is carried out. In this case, the inventors of the present application have found that a carrying-out error for the wafer occurs due to the charges remaining over the surface of a ceramic stage.

That is, when the wafer is pushed up by the lift pins above the stage, the position of the wafer is shifted, thereby causing a carrying-out error when the wafer is delivered to the transfer arm.

Other problems and new characteristics will become clear from the description and accompanying drawings of the present specification.

A manufacturing method of a semiconductor device according to one embodiment includes the steps of: (a) placing a semiconductor wafer over a stage provided in a vacuum vessel, the pressure in the inside of which is reduced by vacuum pumping; and (b) after the step (a), forming plasma in the vacuum vessel in a state where the semiconductor wafer is adsorbed and held by the stage, so that desired processing is performed on the semiconductor wafer. Further, before the step (a), process gas having an electronegativity higher than that of nitrogen gas is introduced into the vacuum vessel to form plasma in the vacuum vessel, thereby allowing the charges remaining over the stage to be eliminated.

Another manufacturing method of a semiconductor device according to one embodiment includes the steps of: (a) placing a semiconductor wafer over a stage provided in a vacuum vessel, the pressure in the inside of which is reduced by vacuum pumping; and (b) after the step (a), forming plasma in the vacuum vessel in a state where the semiconductor wafer is adsorbed and held by the stage with the use of an electrostatic chuck system, so that etching processing is performed on the semiconductor wafer. Further, before the step (a), oxygen gas is introduced into the vacuum vessel to form plasma in the vacuum vessel, thereby allowing the charges remaining over the stage to be eliminated.

According to the above embodiments, it is possible to reduce occurrence of a carrying-out error possibly occurring when a processed semiconductor wafer is carried out and to improve the productivity of plasma processing. Further, damage to the semiconductor wafer can be reduced.

BRIEF DESCRIPTION OF THE DRAWINGS

FIG. 14 is a schematic diagram illustrating a main procedure in the wafer carrying-out procedure illustrated in FIG. 13.

DETAILED DESCRIPTION

Figure 1:
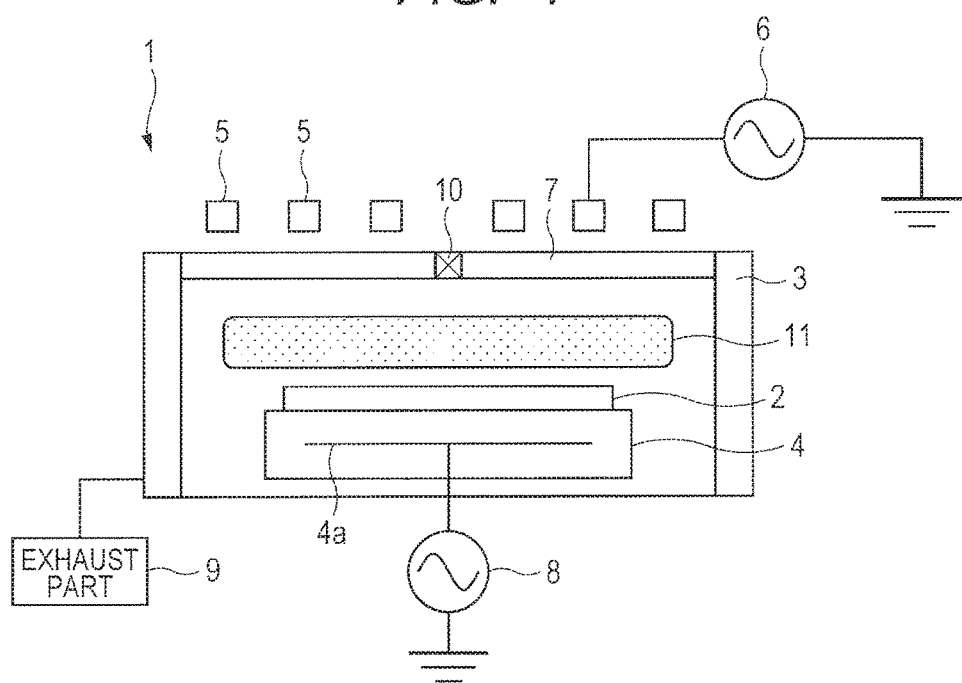
FIG. 1 is a schematic diagram illustrating one example of the structure of a main part of an etching device of an embodiment.

In the following embodiments, description of the same or similar parts will not be repeated in principle, unless particularly necessary.

Also, when necessary for convenience in the following embodiments, description is given by dividing an embodiment into a plurality of sections or embodiments; however, unless otherwise stated, they are not independent of one another, but one is in a relationship such as a modification, details, supplementary explanation, etc. of part or the whole of the others.

In addition, in the following embodiments, when referred to the number of elements, etc. (number of units, numerical value, quantity, range, etc., are included), unless otherwise stated or except when the number is obviously limited to specific numbers in principle, the number is not limited to the specific ones but may be more or less than the specific numbers.

In addition, in the following embodiments, it is needless to say that constituent elements (also including constituent steps, etc.) are not necessarily requisite unless otherwise stated or except when they are obviously requisite in principle.

In addition, in the following embodiments, when it is described as "having A", "including A", or "containing A" with respect to the constituent elements, it is needless to say that it does not exclude other elements unless otherwise stated, etc. Similarly, in the following embodiments, when the shapes and positional relations, etc., of the constituent elements, etc., are referred to, those substantially the same as or similar to the shapes, etc., should be included, unless otherwise stated or except when considered to be clearly otherwise in principle. This also applies to the above numerical values and ranges.

Hereinafter, preferred embodiments of the present invention will be described in detail based on the accompanying drawings. In each diagram for explaining the embodiments, components having the same function will be denoted with the same reference numerals, and duplicative description thereof will be omitted. In addition, in order to make the drawings easier to understand, hatching may be added even in a plan diagram.

<Configuration of Etching Device>

FIG. 1 is a schematic diagram illustrating one example of the structure of a main part of an etching device of an embodiment.

The configuration of the main part of an etching device to be used in a manufacturing method of a semiconductor device of the present embodiment will be described with reference to FIG. 1.

The plasma processing device illustrated in FIG. 1 is a processing device to be used in a microfabrication process of a semiconductor device, and in the present embodiment a plasma etching device for performing dry etching processing is taken and described as one example of the plasma processing device.

A plasma etching device 1 has: a chamber 3 that is a vacuum vessel; a stage 4 that is provided in the chamber 3, over which a semiconductor wafer (semiconductor substrate, wafer) 2, a substrate to be processed, is to be placed; and an exhaust part 9 for reducing the pressure in the chamber 3 (for exhausting the chamber 3).

The plasma etching device 1 of the present embodiment includes the ceramic stage 4, and a case will be described in which the semiconductor wafer 2 is adsorbed and held by an electrostatic chuck (ESC) system.

During desired processing such as etching processing, the pressure in the chamber 3 is reduced to a vacuum state by the exhaust part 9, and further desired gas is introduced into the chamber 3 from a gas introduction portion 10. High-frequency power is supplied from a high-frequency power supply 8 to a lower electrode 4a provided in the stage 4. The semiconductor wafer 2 is adsorbed and held to the surface of the ceramic stage 4 by an electrostatic chuck system.

As illustrated in the later-described FIG. 3, a plurality of lift pins (pin members) 4b for detaching the processed semiconductor wafer 2 from the stage 4 are provided in the stage 4, whereby the semiconductor wafer 2 is placed over or detached from the stage 4 by the up-and-down movement of the lift pins 4b.

Figure 4:
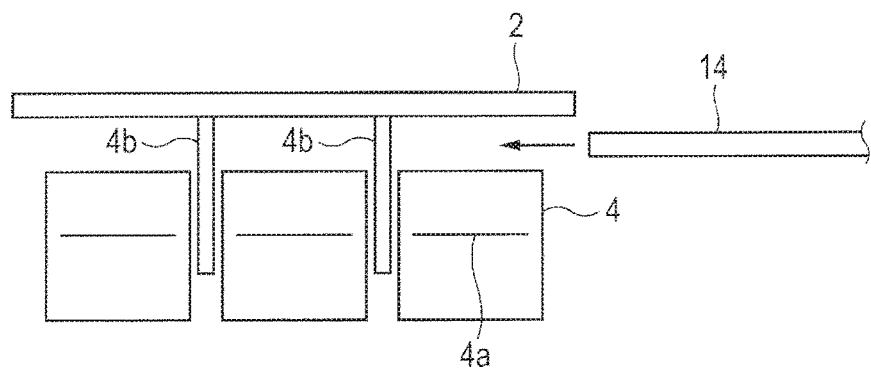
FIG. 4 is a schematic diagram illustrating one example of a state where a wafer is delivered to a transfer arm in the wafer carrying-out procedure illustrated in FIG. 2.

The semiconductor wafer 2 is carried into and out of the chamber 3 via a transfer arm 14 of a robot (not illustrated), as illustrated in the later-described FIG. 4. That is, when the semiconductor wafer 2 is carried into the chamber 3, the transfer arm 14 holding the semiconductor wafer 2 is caused to advance and wait above the stage 4, and the lift pins 4b are raised to protrude from the stage 4, whereby the semiconductor wafer 2 is received from the transfer arm 14 and is held.

Thereafter, the lift pins 4b are lowered in a state where the semiconductor wafer 2 is held by the lift pins 4b, whereby the semiconductor wafer 2 is placed over the stage 4.

On the other hand, when the semiconductor wafer 2 is carried out of the chamber 3, the processed semiconductor wafer 2 is detached from the stage 4 by raising the lift pins 4b, and the semiconductor wafer 2 is caused to wait by raising the lift pins 4b to a predetermined height in a state where the semiconductor wafer 2 is held by the lift pins 4b. The transfer arm 14 is caused to advance below the semiconductor wafer 2 held by the lift pins 4b, whereby the semiconductor wafer 2 is received by the transfer arm 14 from the lift pins 4b.

Thereafter, the semiconductor wafer 2 is carried out of the chamber 3 in a state where the semiconductor wafer 2 is held by the transfer arm 14.

In addition, in the plasma etching device 1 of the present embodiment, a quartz plate 7 is arranged directly above the chamber 3 and a coiled TCP (Transformer Coupled Plasma) electrode 5 is further provided via this quartz plate 7, in order to generate high-density plasma in the chamber 3.

The plasma etching device 1 is structured as follows: electromagnetic waves are generated by applying high-frequency power to the TCP electrode 5 from the high-frequency power supply 6; and high-density plasma is generated by introducing the electromagnetic waves into the chamber 3 through the quartz plate 7 and further by exciting the gas in the chamber 3, thereby allowing plasma processing to be performed.

For example, in etching processing for removing a deposited film such as a polysilicon film, $NF_3$ gas is introduced into the chamber 3 to generate plasma 11 (in this case, $NF_3$ plasma), thereby allowing the etching processing to be performed.

In that case, in the plasma etching device 1, the semiconductor wafer 2 is adsorbed and held by the stage 4 with the use of an electrostatic chuck system in a state where the pressure in the chamber 3 is reduced to 50 mTorr or less, and preferably approximately 15 mTorr; and in this state, dry etching processing is performed on the semiconductor wafer 2. That is, in the plasma etching device 1 of the present embodiment, desired processing such as etching processing is performed in an atmosphere where the pressure in the chamber 3 is reduced to low-pressure.

In the etching processing, current flows between the semiconductor wafer 2 and the electrostatic chuck (ESC) of the stage 4. As a result, the surface of the electrostatic chuck and that of the semiconductor wafer 2 hold charges, and electrostatic adsorption is conducted between + (plus) charges and − (minus) charges, whereby the semiconductor wafer 2 is adsorbed and held.

<Wafer Carrying-Out Procedure>

Figure 13:
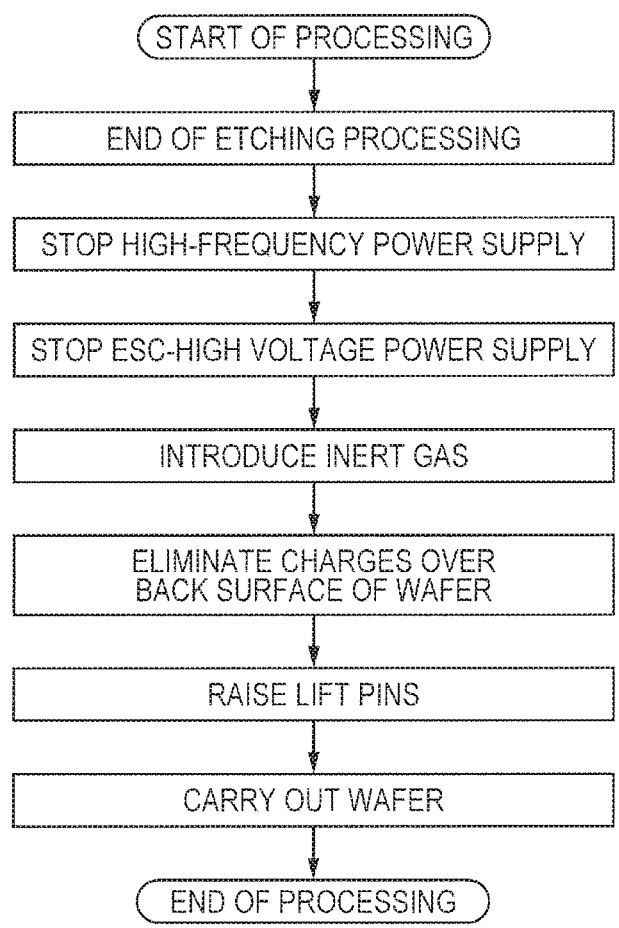
FIG. 13 is a carrying-out flow diagram illustrating a wafer carrying-out procedure of a comparative example.

FIG. 13 is a carrying-out flow diagram illustrating a wafer carrying-out procedure of a comparative example, and FIG. 14 is a schematic diagram illustrating a main procedure in the wafer carrying-out procedure illustrated in FIG. 13. In FIG. 14, the "−" (minus) illustrated in the stage 4 indicates a charge.

First, a carrying-out procedure for a wafer that has been subjected to etching processing, which has been studied as a comparative procedure by the inventors of the present application, will be described with reference to FIGS. 13 and 14.

In the semiconductor wafer carrying-out flow diagram illustrated in FIG. 13, a high-frequency power supply is stopped after etching processing is ended. Herein, the high-frequency power supply 6 in the plasma etching device 1 illustrated in FIG. 1 is stopped.

Next, an ESC-high voltage power supply is stopped. Herein, the high-frequency power supply 8, the power of which is applied to the lower electrode 4a provided in the stage 4 in the plasma etching device 1, is stopped.

Next, inert gas, which is used for the neutralization of the back surface of the wafer, is introduced. Herein, for example, argon (Ar) gas is introduced into the chamber 3. Thereafter, the − charges over the back surface of the wafer are eliminated. Herein, argon gas is introduced into the chamber 3 through the gas introduction portion 10 to form Ar plasma 12 above the semiconductor wafer 2, as illustrated in the plasma neutralization in FIG. 14, and in this state, a reverse high-voltage of, for example, −1000 V is applied to the lower electrode 4a in the stage 4, whereby the back surface of the semiconductor wafer 2 is neutralized.

After the neutralization is completed, the lift pins are raised as illustrated in FIG. 13. Herein, the neutralized semiconductor wafer 2 is pushed up by the lift pins (pin members) 4b and detached upward from the stage 4, as illustrated by the "Carry out wafer" in FIG. 14.

Next, the wafer is carried out, as illustrated in FIGS. 13 and 14. Herein, the semiconductor wafer 2 pushed up by the lift pins 4b is delivered to the transfer arm 14 illustrated in the later-described FIG. 4, whereby the wafer 2 is carried out of the chamber 3 by the transfer arm 14.

After the wafer 2 is carried out, a semiconductor wafer 2 to be processed next is carried into the chamber 3 by using the transfer arm 14 and further delivered to the lift pins 4b, whereby the wafer is placed over the stage 4, as illustrated by the "Carry in next wafer" in FIG. 14. At this time, − (minus) residual charges are slightly present over the surface of the stage 4, as illustrated by A Portions.

After desired etching processing is performed on the semiconductor wafer 2 (the end of etching processing), the high frequency power supply is stopped, the ESC-high voltage power supply is stopped, inert gas is introduced, and the − charges over the back surface of the wafer are eliminated, in accordance with the wafer carrying-out flow illustrated in FIG. 13 and under the same conditions as described above; and after the charges are eliminated, the lift pins are raised.

In that case, the position of the semiconductor wafer 2 is shifted when the wafer 2 is pushed up by the lift pins 4b. It is thought that this occurs due to the influence of the − charges remaining, when the semiconductor wafer 2 processed for the first time is carried out, over the surface of the stage 4.

That is, in the above step of neutralizing charges, most of the − charges are discharged from the stage 4, but a certain amount of slight charges remain in the electrostatic chuck in the stage 4 (see A Portions in FIG. 14), and due to the influence of the residual charges, the position of the semiconductor wafer 2 pushed up by the lift pins 4b is shifted, which has been found by the inventors of the present application.

If positional shift more than a specified amount occurs in the semiconductor wafer 2 pushed up by the lift pins 4b, a transfer error is caused and there arises a problem that the processing may be stopped and the productivity and efficiency of the plasma processing may be lowered.

Further, if positional shift more than the specified amount occurs, there also arises a problem that the semiconductor wafer 2 may be inclined and broken, damaged, or the like.

Next, a wafer carrying-out procedure using the plasma etching device 1 of the present embodiment, by which the above problems can be solved, will be described.

Figure 2:
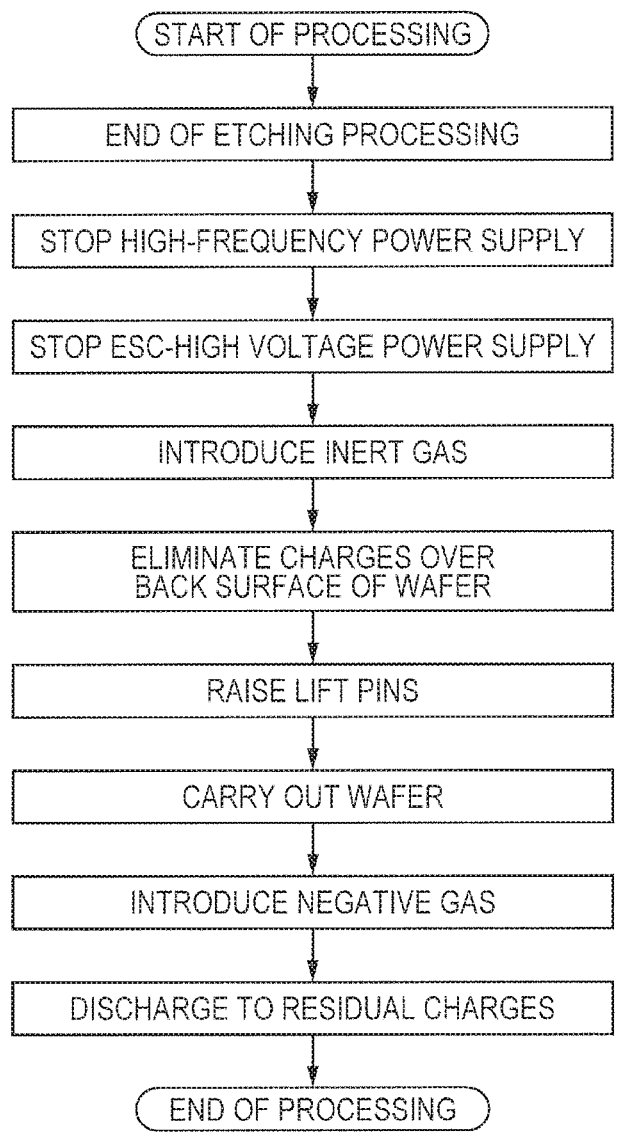
FIG. 2 is a carrying-out flow diagram illustrating one example of a wafer carrying-out procedure of an embodiment.
Figure 5:
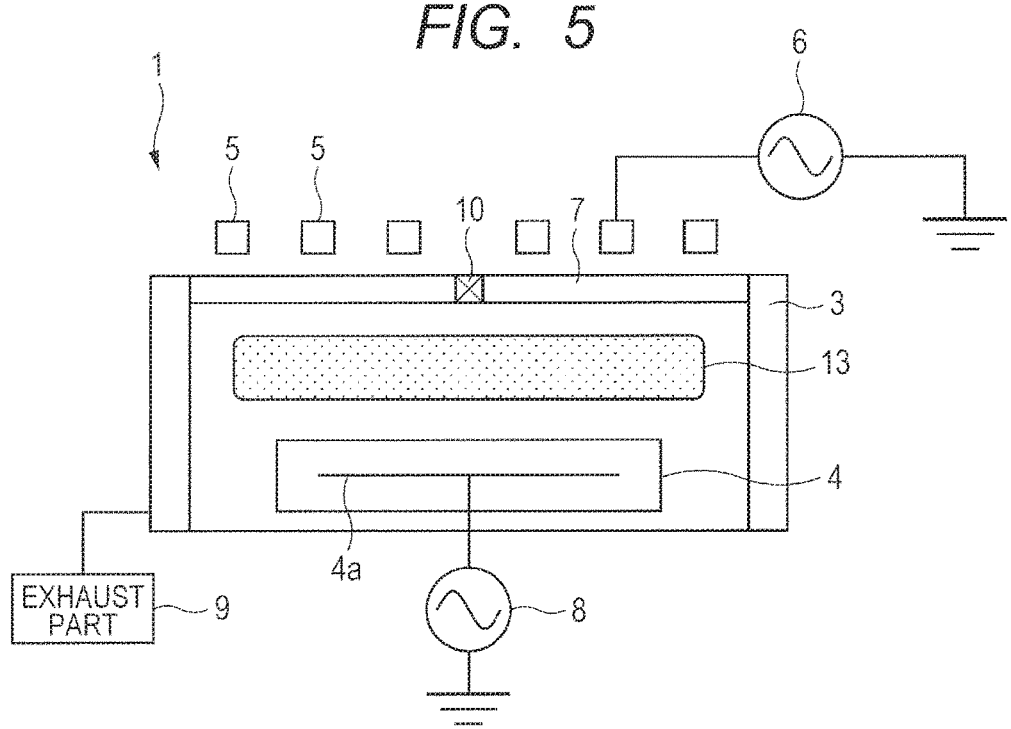
FIG. 5 is a schematic diagram illustrating one example of a state where discharge to residual charges is performed in the wafer carrying-out procedure illustrated in FIG. 2.
Figures 6, 7:
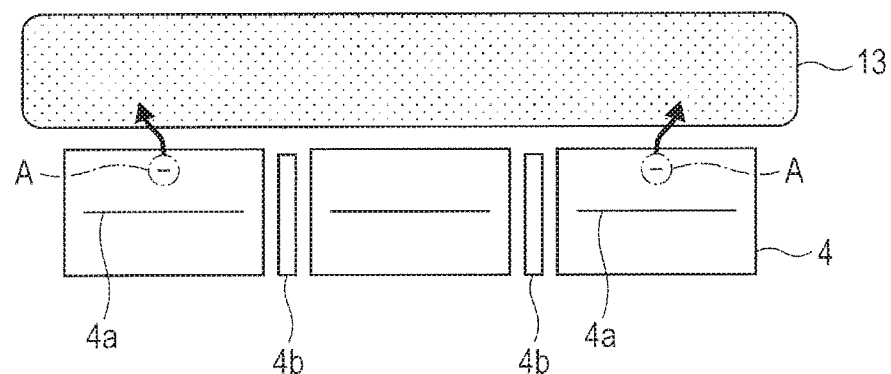
FIG. 6 is an enlarged diagram of the main part illustrated in FIG. 5.
FIG. 7 is a data table illustrating one example of conditions for verifying and evaluating an effect by the wafer carrying-out procedure illustrated in FIG. 2.

FIG. 2 is a carrying-out flow diagram illustrating one example of a wafer carrying-out procedure of an embodiment; FIG. 3 is a schematic diagram illustrating one example of the main procedure in the wafer carrying-out procedure illustrated in FIG. 2; FIG. 4 is a schematic diagram illustrating one example of a state where a wafer is delivered to a transfer arm in the wafer carrying-out procedure illustrated in FIG. 2; FIG. 5 is a schematic diagram illustrating one example of a state where discharge to residual charges is performed in the wafer carrying-out procedure illustrated in FIG. 2; and FIG. 6 is an enlarged diagram of the main part illustrated in FIG. 5. In FIG. 3, the "−" (minus) illustrated in the stage 4 indicates a charge.

A wafer carrying-out procedure of the present embodiment, which is performed after etching processing, will be described.

In the flow diagram illustrated in FIG. 2, a high-frequency power supply is stopped after the etching processing is ended. Herein, the high-frequency power supply 6 in the plasma etching device 1 illustrated in FIG. 1 is stopped. Next, an ESC-high voltage power supply is stopped. Herein, the high-frequency power supply 8, the power of which is applied to the lower electrode 4a provided in the stage 4, is stopped.

Next, inert gas, which is used for the neutralization, is introduced. Herein, for example, argon (Ar) gas is introduced into the chamber 3. Next, the − charges over the back surface of the wafer are eliminated. Herein, argon gas is introduced into the chamber 3 such that Ar plasma 12 is formed as illustrated in the plasma neutralization in FIG. 3, and in this state, a reverse high-voltage of, for example, −1000 V is applied to the lower electrode 4a in the stage 4, whereby the back surface of the semiconductor wafer 2 is neutralized.

After the neutralization is completed, the lift pins are raised as illustrated in FIG. 2. Herein, the neutralized semiconductor wafer 2 is pushed up by the lift pins (pin members) 4b and detached upward from the stage 4, as illustrated by the "Carry out wafer" in FIG. 3.

Figure 3:
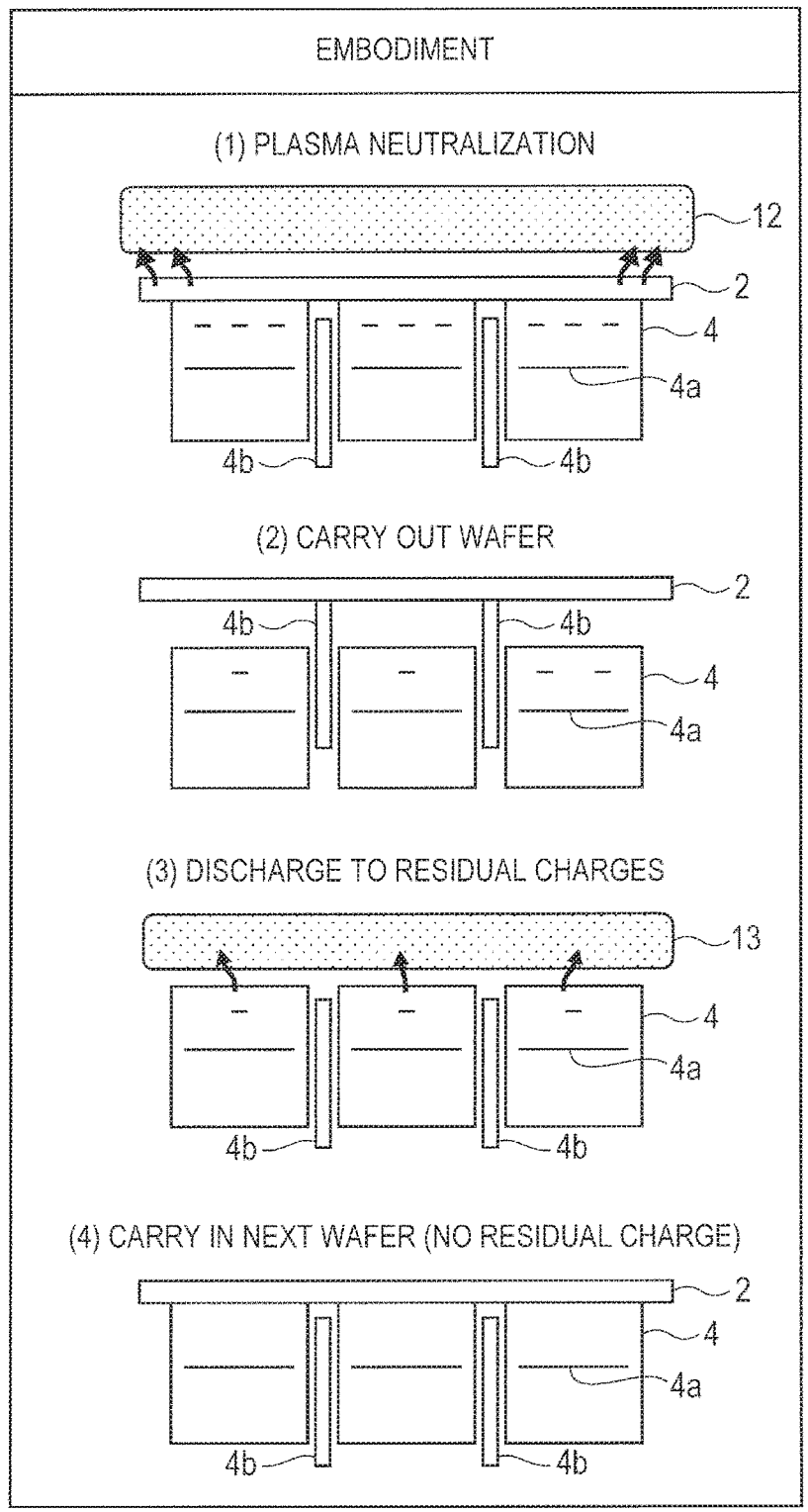
FIG. 3 is a schematic diagram illustrating one example of the main procedure in the wafer carrying-out procedure illustrated in FIG. 2.

Next, the wafer is carried out, as illustrated in FIGS. 2 and 3. Herein, the semiconductor wafer 2 pushed up by the lift pins 4b is delivered to the transfer arm 14 illustrated in FIG. 4, whereby the wafer 2 is carried out of the chamber 3 while being held by the transfer arm 14.

After the wafer is carried out, negative gas is introduced as illustrated in FIG. 2. Herein, oxygen ($O_2$) gas, which is process gas having an electronegativity higher than that of nitrogen gas, is introduced, as negative gas, into the chamber 3 via the gas introduction portion 10.

After the introduction, discharge to residual charges is performed as illustrated in FIG. 2. Herein, for example, the output of 1000 W of the high-frequency power supply 6 is applied. Thereby, $O_2$ plasma 13 is formed above the stage 4, as illustrated in FIG. 5, so that the discharge to residual charges is performed by the $O_2$ plasma 13, as illustrated in FIGS. 2 and 3. That is, the – (minus) charges (A Portions) remaining over the surface of the stage 4 are eliminated by forming the $O_2$ plasma 13 in the chamber 3, as illustrated in FIG. 6. The $O_2$ plasma 13 at the time is $O+2e^-=O^{2-}$.

Next, a semiconductor wafer 2 to be processed next is carried into the chamber 3 by using the transfer arm 14 and transferred above the stage 4, as illustrated by the "Carry in next wafer" in FIG. 3. Further, the semiconductor wafer 2 is delivered to the lift pins 4b above the stage 4 and the lift pins 4b are lowered, whereby the semiconductor wafer 2 is placed over the stage 4. At this time, there arises a state where no residual charge is present over the surface of the stage 4.

After desired etching processing is performed on the semiconductor wafer 2 (the end of etching processing), the high frequency power supply is stopped, the ESC-high voltage power supply is stopped, inert gas is introduced, and the – charges over the back surface of the wafer are eliminated, in accordance with the wafer carrying-out flow illustrated in FIG. 2 and under the same conditions and procedure as described above; and after the charges are eliminated, the lift pins are raised.

In the raising of the lift pins, the semiconductor wafer 2 is pushed up by the lift pins 4b above the stage 4. At that time, there arises a state where no residual charge is present over the surface of the stage 4, and hence the position of the semiconductor wafer 2 is not shifted even when the semiconductor wafer 2 is pushed up by the lift pins 4b, so that the semiconductor wafer 2 can be pushed up to a predetermined position (a position within a specified range).

Thereafter, the semiconductor wafer 2 pushed up by the lift pins 4b is delivered to the transfer arm 14. At this time, the semiconductor wafer 2 is pushed up to the predetermined position (the position within the specified range), and hence the semiconductor wafer 2 can be delivered to the transfer arm 14 without causing a transfer error. Then, the semiconductor wafer 2 is carried out of the chamber 3 while being held by the transfer arm 14.

According to the manufacturing method of a semiconductor device of the present embodiment, before the semiconductor wafer 2 is placed over the stage 4 in the chamber 3, the pressure in the inside of which is reduced, the charges remaining over the stage 4 are eliminated by introducing $O_2$ gas into the chamber 3 and further by forming the $O_2$ plasma 13 in the chamber 3, whereby occurrence of a carrying-out error, which may occur when the processed semiconductor wafer 2 is carried out, can be reduced and the productivity of plasma processing can be improved.

That is, after the first semiconductor wafer 2 is carried out by raising the lift pins 4b, plasma discharge is formed at low pressure (50 mTorr or less) by using negative gas such as $O_2$ gas, thereby allowing the residual charges over the surface of the ceramic stage 4 to be eliminated. More specifically, the first processed semiconductor wafer 2 is carried out of the chamber 3 by raising the lift pins 4b, and then the $O_2$ plasma 13 is discharged in the chamber 3, thereby allowing the residual charges remaining over the surface of the ceramic stage 4 to be eliminated.

Thereby, a transfer error, such as a carry-out error for the semiconductor wafer 2, can be reduced, which can improve the productivity of plasma processing and also the efficiency of the plasma processing using the plasma etching device 1.

Further, by reducing a transfer error such as a carry-out error, the service life of an electrostatic chuck can be extended and the cost in plasma processing can be reduced.

In the flow of the comparative example illustrated in FIG. 14, the next semiconductor wafer 2 is processed in a state where the residual charges illustrated by A Portions remain over the surface of the stage 4, and hence a transfer error for the semiconductor wafer 2 is likely to occur. On the other hand, in the flow of the present embodiment illustrated in FIG. 3, residual charges are reset (eliminated) for each wafer by discharging the $O_2$ plasma 13, and hence occurrence of a transport error for the semiconductor wafer 2 can be reduced.

Further, occurrence of a carry-out error, which may occur when the processed semiconductor wafer 2 is carried out, can be reduced, thereby allowing a damage to the semiconductor wafer 2 to be reduced.

The timings, at which the steps of negative gas introduction and discharge to residual charges are performed, will now be described.

After the plasma etching device 1 is activated, a semiconductor wafer (first semiconductor wafer) 2, which is to be processed for the first time of a desired lot, is first etched, and further the high frequency power supply is stopped, the ESC-high voltage power supply is stopped, inert gas is introduced, the – charges over the back surface of the wafer are eliminated, the lift pins are raised, and the wafer is carried out (the first semiconductor wafer is carried out), in accordance with the wafer carrying-out flow illustrated in FIG. 2.

After the first semiconductor wafer is carried out and before a semiconductor wafer (second semiconductor wafer) 2, which is to be processed for the second time and is different from the first semiconductor wafer 2, is placed over the stage 4, the steps of negative gas introduction and discharge to residual charges are performed, whereby the charges are eliminated from the surface of the stage 4.

That is, after the plasma etching device 1 is activated, a semiconductor wafer (first semiconductor wafer) 2, which is to be processed for the first time, is etched, and after that, the high-frequency power supply is stopped, the ESC-high voltage power supply is stopped, inert gas is introduced, the – charges over the back surface of the wafer are eliminated, and the lift pins are raised, whereby this semiconductor wafer 2 is carried out of the chamber 3.

Thereafter, before a semiconductor wafer (second semiconductor wafer) 2, which is to be processed for the second time, is placed over the stage 4 in the chamber 3, process gas is introduced into the chamber 3 to form desired plasma in the chamber 3, thereby allowing the charges remaining over the stage 4 to be eliminated.

In the case of the first semiconductor wafer 2, few charges remain over the surface of the stage 4 after the plasma etching device 1 is activated. Therefore, the residual charges over the surface of the stage 4 may be eliminated before at least the second semiconductor wafer 2 is placed over the stage 4 in the chamber 3.

Alternatively, after the plasma etching device 1 is activated and before the first semiconductor wafer 2 of a desired lot is placed over the stage 4 in the chamber 3, process gas may be introduced into the chamber 3 to form desired plasma in the chamber 3, thereby allowing the charges remaining over the stage 4 to be eliminated.

In other words, after the plasma etching device 1 is activated and before the first semiconductor wafer 2 is placed over the stage 4, desired plasma may be formed in the chamber 3, thereby allowing the charges remaining over the stage 4 to be eliminated.

As described above, the steps of negative gas introduction and discharge to residual charges may be performed at any timings, as long as the timings after the first semiconductor wafer 2 is etched and before at least the second semiconductor wafer 2 is placed over the stage 4.

<Verification and Evaluation of Effect and Result Thereof>

Figures 8, 9:
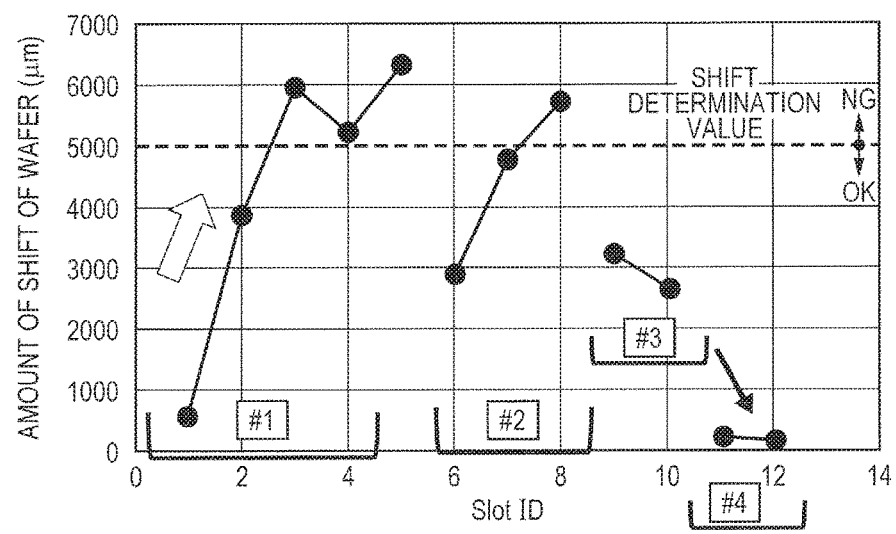
FIG. 8 is a graph illustrating results of the verification and evaluation performed based on the conditions illustrated in FIG. 7.
FIG. 9 is a data table illustrating one example of preferred conditions obtained from the results of the verification and evaluation illustrated in FIG. 8.
Figures 10, 11, 12:
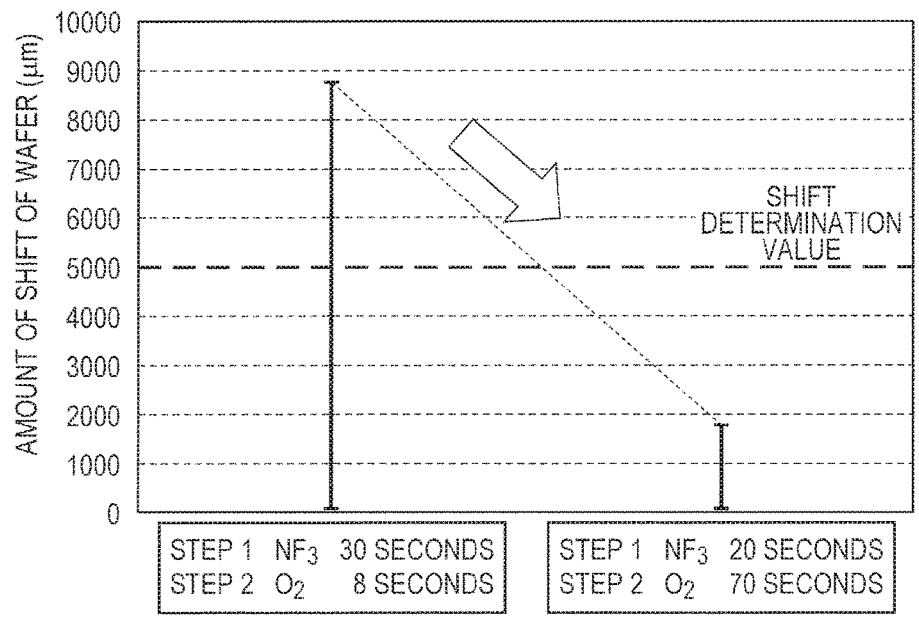
FIG. 10 is a graph illustrating an effect obtained from the verification and evaluation performed under the conditions illustrated in FIG. 9.
FIG. 11 is a data table illustrating an effect obtained from the results of the verification and evaluation illustrated in FIG. 8.
FIG. 12 is a periodic table of elements illustrating one example of the ranges of the electronegativities of the gas introduced in the discharge to residual charges in the wafer carrying-out procedure illustrated in FIG. 2.

FIG. 7 is a data table illustrating one example of conditions for verifying and evaluating an effect by the wafer carrying-out procedure illustrated in FIG. 2; FIG. 8 is a graph illustrating results of the verification and evaluation performed based on the conditions illustrated in FIG. 7; and FIG. 9 is a data table illustrating one example of preferred conditions obtained from the results of the verification and evaluation illustrated in FIG. 8. FIG. 10 is a graph illustrating an effect obtained from the verification and evaluation performed under the conditions illustrated in FIG. 9; and FIG. 11 is a data table illustrating an effect obtained from the results of the verification and evaluation illustrated in FIG. 8.

In the verification and evaluation illustrated in FIG. 7, the step of using $NF_3$ gas (hereinafter, also referred to as step 1) and the step of using $O_2$ gas (hereinafter, also referred to as step 2) are evaluated as #1 to #4, respectively. $NF_3$ gas is mainly used for removing a silicon (Si)-based deposited film in etching processing, while $O_2$ gas is mainly used for removing a carbon (C)-based deposited film.

In the evaluation of #1 illustrated in FIG. 7, the step 1 ($NF_3$ gas) is performed for 30 seconds, and consecutively thereto the step 2 ($O_2$ gas) is performed for 8 seconds.

In the evaluation of #2, the step 1 ($NF_3$ gas) is performed for 45 seconds, and consecutively thereto the step 2 ($O_2$ gas) is performed for 8 seconds. That is, only the step 1 ($NF_3$ gas) is performed for 15 seconds longer (the time for flowing $NF_3$ gas is extended).

In the evaluation of #3, the step 1 ($NF_3$ gas) is performed for 20 seconds, and consecutively thereto the step 2 ($O_2$ gas) is performed for 40 seconds.

In the evaluation of #4, the step 1 ($NF_3$ gas) is performed for 20 seconds, and consecutively thereto the step 2 ($O_2$ gas) is performed for 60 seconds. That is, only the step 2 ($O_2$ gas) is performed for 20 seconds longer (the time for flowing $O_2$ gas is extended).

In the evaluations of #1 to #4, an interval of 30 minutes is provided between the adjacent evaluations, and in this interval the atmosphere in the chamber 3 is reset by cleaning the inside thereof.

The graph of FIG. 8 is obtained by measuring, under these conditions, an amount of the positional shift of the semiconductor wafer 2, occurring when the wafer 2 is pushed up by the lift pins 4b.

In the evaluation of #1, measured values of the amounts of shift of five semiconductor wafers 2 are illustrated, and in the evaluation of #2, measured values of the amounts of shift of three semiconductor wafers 2 are illustrated, as illustrated in FIG. 8. In the evaluation of #3, measured values of the amounts of shift of two semiconductor wafers 2 are illustrated, and also in the evaluation of #4, measured values of the amounts of shift of two semiconductor wafers 2 are illustrated as well.

In the measured values of the amounts of shift illustrated in FIG. 8, a transfer error occurs when the amount of shift of the semiconductor wafer 2 is more than 5000 µm, so in this case, it is determined that shift determination is NG; on the other hand, when the amount of shift thereof is less than 5000 µm, no transfer error occurs, so it is determined that shift determination is OK.

That is, in the present embodiment, a criterion, for determining whether the semiconductor wafer 2 pushed up by the lift pins 4b illustrated in FIG. 3 is arranged (OK) or not arranged (NG) at a predetermined position (position within a specified range), is set such that the above amount of shift is 5000 µm, and therefore an amount of shift of 5000 µm is set as a shift determination value in FIG. 8.

In the evaluation of #1 illustrated in FIG. 7, the measured values of the amounts of shift of the first and second semiconductor wafers 2 are less than 5000 µm, and therefore the shift determinations for them are OK, but those of the third, fourth, and fifth semiconductor wafers 2 are more than 5000 µm, and therefore the shift determinations for them are NG. That is, it is found as a trend that the amount of the positional shift of the semiconductor wafer 2 is increased to a larger value as the number of the processed semiconductor wafers 2 is increased.

In the evaluation of #2, the measured values of the amounts of shift of the first and second semiconductor wafers 2 are less than 5000 µm, and therefore the shift determinations for them are OK, but that of the third semiconductor wafer 2 is more than 5000 µm, and therefore the shift determination for it is NG. That is, it is found as a trend that the amount of the positional shift of the semiconductor wafer 2 is increased to a larger value as the number of the processed semiconductor wafers 2 is increased, and it is found that this result shows almost the same trend as the result of the evaluation of #1.

Thereby, it is found, for the evaluations of #1 to #2 illustrated in FIG. 7, that extension of the $NF_3$ gas step by 15 seconds has no effect.

In the evaluation of #3, the measured values of the amounts of shift of the first and second semiconductor wafers 2 are both approximately 3000 µm, which is much less than 5000 µm, and therefore the shift determinations for them are OK. In addition, the measured value of the second semiconductor wafer 2 is less than that of the first semiconductor wafer 2, and therefore it can be determined as a trend that the measured value of the amount of shift may not be more than 5000 µm even if the number of the processed semiconductor wafers 2 is increased.

In the evaluation of #4, the measured values of the amounts of shift of the first and second semiconductor wafers 2 are both approximately 100 to 200 µm, which are much less than the measured value of #3. The measured value of #4 is also much less than 5000 µm similarly to the evaluation of #3, and therefore the shift determination is OK.

Because the measured values of the amounts of shift of the first and second semiconductor wafers 2 are almost equal to each other, and therefore it can be determined as a trend that the measured value of the amount of shift may not be more than 5000 μm even if the number of the processed semiconductor wafers 2 is increased, similarly to the evaluation of #3.

It is found from the results of the evaluations of #3 and #4 illustrated in FIG. 7 that extending the $O_2$ gas step by 20 seconds is effective because the measured value of the amount of shift of #4 is much less than that of #3.

It can be said that extending the time of the $O_2$ gas step as described above is very effective in reducing the amount of the positional shift of the semiconductor wafer 2.

Therefore, FIG. 10 illustrates the results of evaluating the amounts of the positional shift of 100 semiconductor wafers by using the conditions illustrated in FIG. 9. In detail, as it was found that extending the time of the $O_2$ gas step as described above is effective in reducing the amount of the positional shift of the semiconductor wafer 2, 100 semiconductor wafers 2 were newly evaluated in a way in which the step 1 ($NF_3$ gas) was performed for 20 seconds and the step 2 ($O_2$ gas) for 70 seconds, as illustrated in FIG. 9.

In that case, the pressure in the chamber 3 was 65 mTorr for the step 1 ($NF_3$ gas) and 15 mTorr for the step 2 ($O_2$ gas). That is, the step 2 ($O_2$ gas) was evaluated in a low-pressure atmosphere of 50 mTorr or less.

One hundred semiconductor wafers 2 were similarly evaluated under the conditions of #1 illustrated in FIG. 7.

FIG. 10 illustrates the ranges of variation in the amounts of the positional shift of the semiconductor wafer 2, occurring in the evaluation in which the time of the $O_2$ gas step is extended to 70 seconds and in the evaluation performed under the conditions of #1. In the evaluation of 30 seconds of the step 1 ($NF_3$ gas)+8 seconds of the step 2 ($O_2$ gas), the upper limit of the variation in the measured values is close to 9000 μm, which is far more than the shift determination value of 5000 μm, as illustrated in FIG. 10. However, in the evaluation of 20 seconds of the step 1 ($NF_3$ gas)+70 seconds of the step 2 ($O_2$ gas), the upper limit of variation in the measured values of the amounts of shift is as extremely small as less than 2000 μm, which is much less than the shift determination value of 5000 μm. That is, in comparison with the evaluation of 30 seconds of the step 1 ($NF_3$ gas)+8 seconds of the step 2 ($O_2$ gas), the evaluation of 20 seconds of the step 1 ($NF_3$ gas)+70 seconds of the step 2 ($O_2$ gas) has a smaller upper limit of variation in the measured values (which is much less than the shift determination value of 5000 μm) and also a very smaller range of variation.

From the results of FIG. 10, it is possible to obtain an effect on an amount of the positional shift of the semiconductor wafer 2 by introducing $O_2$ gas and to obtain a further large effect on an amount thereof by introducing $O_2$ gas for a longer time.

As a result, it has been found as illustrated in FIG. 11 that: in the step 1 ($NF_3$ gas), no effect is obtained even if the time of the step is extended; however, in the step 2 ($O_2$ gas), a large effect can be obtained by extending the time of the step.

<Electronegativity of Gas to be Used>

FIG. 12 is a periodic table of elements illustrating one example of the ranges of the electronegativities of the gas to be introduced in the discharge to residual charges in the wafer carrying-out procedure illustrated in FIG. 2.

In the manufacturing method of a semiconductor device according to the present embodiment, negative gas is introduced in the negative gas introduction step illustrated in FIG. 2, and discharge to residual charges is performed in a state where the negative gas is introduced into the chamber 3, thereby allowing the charges over the surface of the ceramic stage 4 to be eliminated. Therefore, the electronegativity of the used gas is greatly involved.

Electronegativity is a relative measure of the strength with which an atom in a molecule draws an electron. Assuming that different types of atoms are chemically bonded to each other, the charge distribution of electrons at each atom takes a different distribution from the case where these atoms are isolated. This is due to the influence from the atom in the partner of the bond, and because there is a difference in the strength of drawing an electron depending on the type of an atom.

And, the measure of this strength of drawing an electron can be determined to be relative for each type of atoms, and this measure is electronegativity.

It has been found from the evaluation results of FIGS. 7 to 10 that $NF_3$ gas has no effect on the positional shift of the semiconductor wafer 2. Nitrogen (N) is contained in $NF_3$ gas, and the electronegativity of nitrogen is 3.04 according to the periodic table of elements illustrated in FIG. 12. Therefore, as the gas to be used in the manufacturing method of a semiconductor device (discharge to residual charges by the plasma etching device 1) of the present embodiment, gas containing an element having an electronegativity higher than that of nitrogen should be used. That is, it is necessary to perform discharge to residual charges by using gas having an electronegativity higher than that of nitrogen gas.

Specifically, gas containing an element having an electronegativity higher than that of nitrogen is introduced as negative gas in the negative gas introduction step illustrated in FIG. 2, and discharge to residual charges is performed in a state where the negative gas is introduced into the chamber 3.

Herein, elements having an electronegativity higher than 3.04 are chlorine (Cl)=3.16, oxygen (O)=3.44, and fluorine (F)=3.98 from FIG. 12, and gas containing any one of these elements is introduced into the chamber 3 in the negative gas introduction step illustrated in FIG. 2 to perform discharge to residual charges, thereby allowing the charges over the surface of the stage 4 to be drawn and eliminated from the stage 4.

It is more preferable to use, of chlorine, oxygen and fluorine, oxygen gas or fluorine gas in terms of the magnitude of electronegativity, and it can be said from the evaluation results of FIGS. 7 to 10 that it is preferable to form the $O_2$ plasma 13 by using oxygen gas ($O_2$ gas) in a low-pressure atmosphere of 50 mTorr or less.

The invention made by the present inventors has been specifically described based on preferred embodiments; however, the invention should not be limited to the aforementioned embodiments, and it is needless to say that the invention may be modified variously within a range not departing from the gist thereof.

For example, in the above embodiments, the case where the plasma processing by a plasma processing device is dry etching has been described as an example, but the plasma processing by the plasma processing device is not limited to dry etching, and processing, such as CVD (Chemical Vapor Deposition) or sputtering, may be adopted.

In addition, in the above embodiments, the case where the stage in the plasma etching device includes ceramics has been described, but the stage may include another material other than ceramics as long as it has a relatively high dielectric constant.

In addition, in the above embodiments, the case where a shift determination value, by which the amount of the positional shift of a semiconductor wafer is determined, is set to 5000 μm has been described, but the shift determination value is not limited to 5000 μm, and another numerical value other than 5000 μm may be set.

What is claimed is:

1. A manufacturing method of a semiconductor device, the manufacturing method comprising:
    placing a semiconductor wafer over a stage provided in a vacuum vessel, pressure in an inside of the vacuum vessel being reduced by vacuum pumping; and
    after the placing of the semiconductor wafer, forming a plasma in the vacuum vessel in a state where the semiconductor wafer is adsorbed and held by the stage, so that a desired processing is performed on the semiconductor wafer,
    wherein before the placing of the semiconductor wafer, a process gas having an electronegativity higher than that of nitrogen gas is introduced into the vacuum vessel to form another plasma in the vacuum vessel while the semiconductor wafer is outside the vacuum vessel, thereby allowing a charge remaining over the stage to be eliminated before the wafer is placed in the chamber.

2. The manufacturing method of a semiconductor device according to claim 1, wherein an etching processing is performed on the semiconductor wafer as the desired processing.

3. The manufacturing method of a semiconductor device according to claim 1, wherein the process gas includes oxygen gas or fluorine gas.

4. The manufacturing method of a semiconductor device according to claim 1, wherein in the placing of the semiconductor wafer, the pressure inside the vacuum vessel is reduced to 50 mTorr or less.

5. The manufacturing method of a semiconductor device according to claim 1, wherein after the forming the plasma, a first semiconductor wafer is carried out of the vacuum vessel, and after that and before the placing of the semiconductor wafer is performed on a second semiconductor wafer different from the first semiconductor wafer, the process gas is introduced into the vacuum vessel to form said another plasma in the vacuum vessel, thereby allowing the charge remaining over the stage to be eliminated.

6. The manufacturing method of a semiconductor device according to claim 1, wherein before the placing of the semiconductor wafer is performed on a first semiconductor wafer of a desired lot, the process gas is introduced into the vacuum vessel to form said another plasma in the vacuum vessel, thereby allowing a charge remaining over the stage to be eliminated.

7. The manufacturing method of a semiconductor device according to claim 1, wherein the semiconductor wafer is adsorbed and held by the stage with an electrostatic chuck system.

8. The manufacturing method of a semiconductor device according to claim 1, wherein, after the forming the plasma, the semiconductor wafer is pushed up by a pin member above the stage, and the semiconductor wafer is delivered to a transfer arm and carried out.

9. A manufacturing method of semiconductor device, the manufacturing method comprising:
    placing a semiconductor wafer over a stage provided in a vacuum vessel, pressure in an inside of the vacuum vessel being reduced by vacuum pumping; and
    after the placing of the semiconductor wafer, forming a plasma in the vacuum vessel in a state where the semiconductor wafer is adsorbed and held by the stage with an electrostatic chuck system, so that an etching processing is performed on the semiconductor wafer,
    wherein, before the placing of the semiconductor wafer, oxygen gas is introduced into the vacuum vessel to form another plasma in the vacuum vessel while the semiconductor wafer is outside the vacuum vessel, thereby allowing a charge remaining over the stage to be eliminated before the wafer is placed in the chamber.

10. The manufacturing method of a semiconductor device according to claim 9, wherein in the placing of the semiconductor wafer, the pressure inside the vacuum vessel is reduced to 50 mTorr or less.

11. The manufacturing method of a semiconductor device according to claim 9, wherein after the forming the plasma, a first semiconductor wafer is carried out of the vacuum vessel, and after that and before the placing of the semiconductor wafer is performed on a second semiconductor wafer different from the first semiconductor wafer, the process gas is introduced into the vacuum vessel to form said another plasma in the vacuum vessel, thereby allowing the charge remaining over the stage to be eliminated.

12. The manufacturing method of a semiconductor device according to claim 9, wherein, before the placing of the semiconductor wafer is performed on the first semiconductor wafer of a desired lot, the process gas is introduced into the vacuum vessel to form said another plasma in the vacuum vessel, thereby allowing a charge remaining over the stage to be eliminated.

13. The manufacturing method of a semiconductor device according to claim 9, wherein after the forming the plasma, the semiconductor wafer is pushed up by a pin member above the stage, and the semiconductor wafer is delivered to a transfer arm and carried out.

14. The manufacturing method of a semiconductor device according to claim 1, wherein the process gas includes fluorine gas.

15. The manufacturing method of a semiconductor device according to claim 1, further comprising:
    after the forming said another plasma, placing another semiconductor wafer over the stage in the vacuum vessel.

16. The manufacturing method of a semiconductor device according to claim 15, further comprising:
    after the placing said another semiconductor wafer over the stage, forming the plasma in the vacuum vessel in a state where said another semiconductor wafer is adsorbed and held by the stage, such that the desired processing is then performed on said another semiconductor wafer.

17. A manufacturing method of a semiconductor device, the manufacturing method comprising:
    placing a first semiconductor wafer over a stage provided in a vacuum vessel;
    forming a plasma in the vacuum vessel in a state where the first semiconductor wafer is adsorbed and held by the stage, such that a desired processing is performed on the first semiconductor wafer;
    carrying the first semiconductor wafer out of the vacuum vessel;
    after the carrying the first semiconductor wafer out of the vacuum vessel, introducing a process gas into the vacuum vessel to form another plasma in the vacuum vessel and to eliminate a charge remaining over the stage; and
    after the forming said another plasma, placing a second semiconductor wafer over the stage in the vacuum vessel.

18. The manufacturing method of a semiconductor device according to claim 17, wherein an electronegativity of the process gas is higher than an electronegativity of nitrogen gas.

19. The manufacturing method of a semiconductor device according to claim 17, further comprising:
   forming the plasma in the vacuum vessel in a state where the second semiconductor wafer is adsorbed and held by the stage, such that the desired processing is performed on the second semiconductor wafer.

20. The manufacturing method of a semiconductor device according to claim 17, wherein the process gas includes fluorine gas.

* * * * *